United States Patent
Harashima et al.

(10) Patent No.: US 10,083,388 B1
(45) Date of Patent: Sep. 25, 2018

(54) USB DEVICE

(71) Applicant: Toshiba Memory Corporation, Minato-ku (JP)

(72) Inventors: Shiro Harashima, Sagamihara (JP); Kosuke Adachi, Yokohama (JP); Shanying Pan, Chigasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/701,535

(22) Filed: Sep. 12, 2017

(30) Foreign Application Priority Data

Mar. 24, 2017 (JP) ................................. 2017-059931

(51) Int. Cl.
*H05K 1/14* (2006.01)
*G06K 19/077* (2006.01)
*H05K 5/02* (2006.01)

(52) U.S. Cl.
CPC ..... *G06K 19/07732* (2013.01); *H05K 5/0278* (2013.01)

(58) Field of Classification Search
CPC ................. H05K 5/0278; G06K 19/07732
USPC .......................................................... 361/737
See application file for complete search history.

(56) References Cited

U.S. PATENT DOCUMENTS

| | | | |
|---|---|---|---|
| 6,522,534 B1 * | 2/2003 | Wu .................... | G06K 19/041 312/223.2 |
| 7,364,445 B1 * | 4/2008 | Ni ...................... | H05K 5/0278 439/140 |
| 7,551,450 B2 | 6/2009 | Sugawara et al. | |
| 7,881,051 B2 * | 2/2011 | Kim .................... | H05K 5/0278 361/679.31 |
| 8,192,211 B1 * | 6/2012 | Huang ................. | H01R 13/447 439/131 |
| 2004/0233645 A1 * | 11/2004 | Chen .................... | G06F 1/1632 361/737 |

FOREIGN PATENT DOCUMENTS

JP  2005-18731  1/2005

* cited by examiner

*Primary Examiner* — Hung S Bui
(74) *Attorney, Agent, or Firm* — Oblon, McClelland, Maier & Neustadt, L.L.P.

(57) ABSTRACT

According to one embodiment, a USB device includes a USB connector, a casing, and a holding member. The casing is provided with an opening. The holding member includes a holder, a support, and a first extension. The holder holds the USB connector. The support extends from the holder. The first extension has a protrusion, extends from the support, and is bendable. The protrusion is housed in the opening.

20 Claims, 9 Drawing Sheets

USB DEVICE

CROSS-REFERENCE TO RELATED APPLICATIONS

This application is based upon and claims the benefit of priority from Japanese Patent Application No. 2017-059931, filed on Mar. 24, 2017, the entire contents of which are incorporated herein by reference.

FIELD

Embodiments described herein relate generally to a USB device.

BACKGROUND

A USB device having a USB connector includes a casing for housing a substrate and a terminal for mounting the USB connector.

When the USB connector and the casing are pulled away from each other, the casing may be detached from the USB connector.

DETAILED DESCRIPTION

In general, according to one embodiment, a USB device includes a USB connector, a casing, and a holding member. The casing is provided with a port that opens in a first direction, and has a first inner face that is provided with an opening, faces a direction intersecting with the first direction, and faces the port. The holding member includes a holder, a support, and a first extension. The holder is at least partially housed in the port, includes an end outside the port, and is provided with an insertion port that opens in the end, and the holder holds the USB connector while the USB connector projects outward through the insertion port. The support extends from the holder inside the port. The first extension includes a first face facing the first inner face and a protrusion on the first face, and extends inside the port from the support along the first inner face in a direction toward the end or in a direction orthogonal to the first direction. The first extension is bendable. The protrusion is housed in the opening.

First Embodiment

A first embodiment is described below with reference to FIG. 1 to FIG. 8. In the present specification, constituent elements according to embodiments may be represented differently and described differently. The constituent elements and descriptions thereof may be expressed differently from those described herein. Further, constituent elements given no different expressions and descriptions thereof may also be expressed differently.

Figure 1:
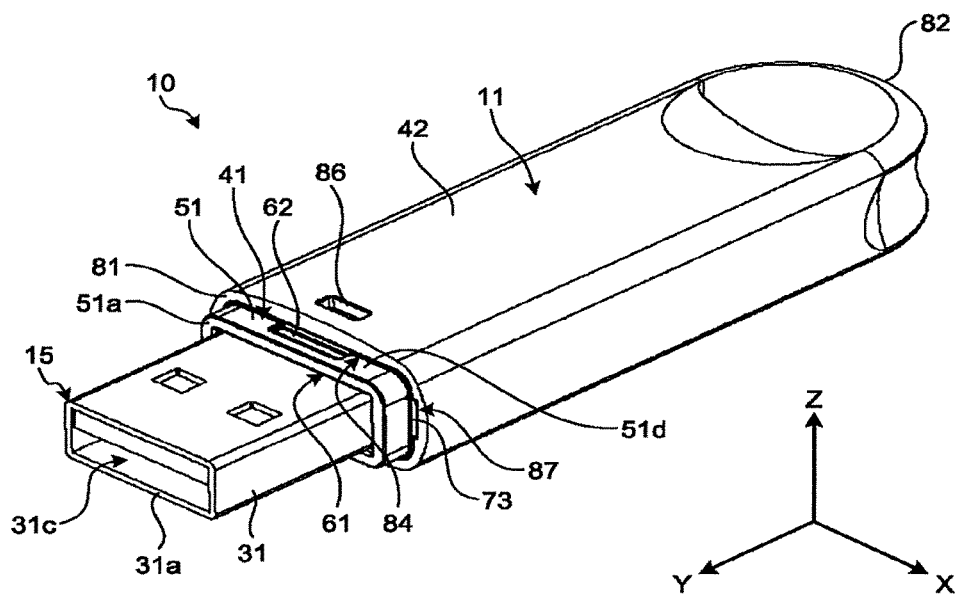
FIG. 1 is a perspective view illustrating a USB memory according to a first embodiment.
Figure 2:
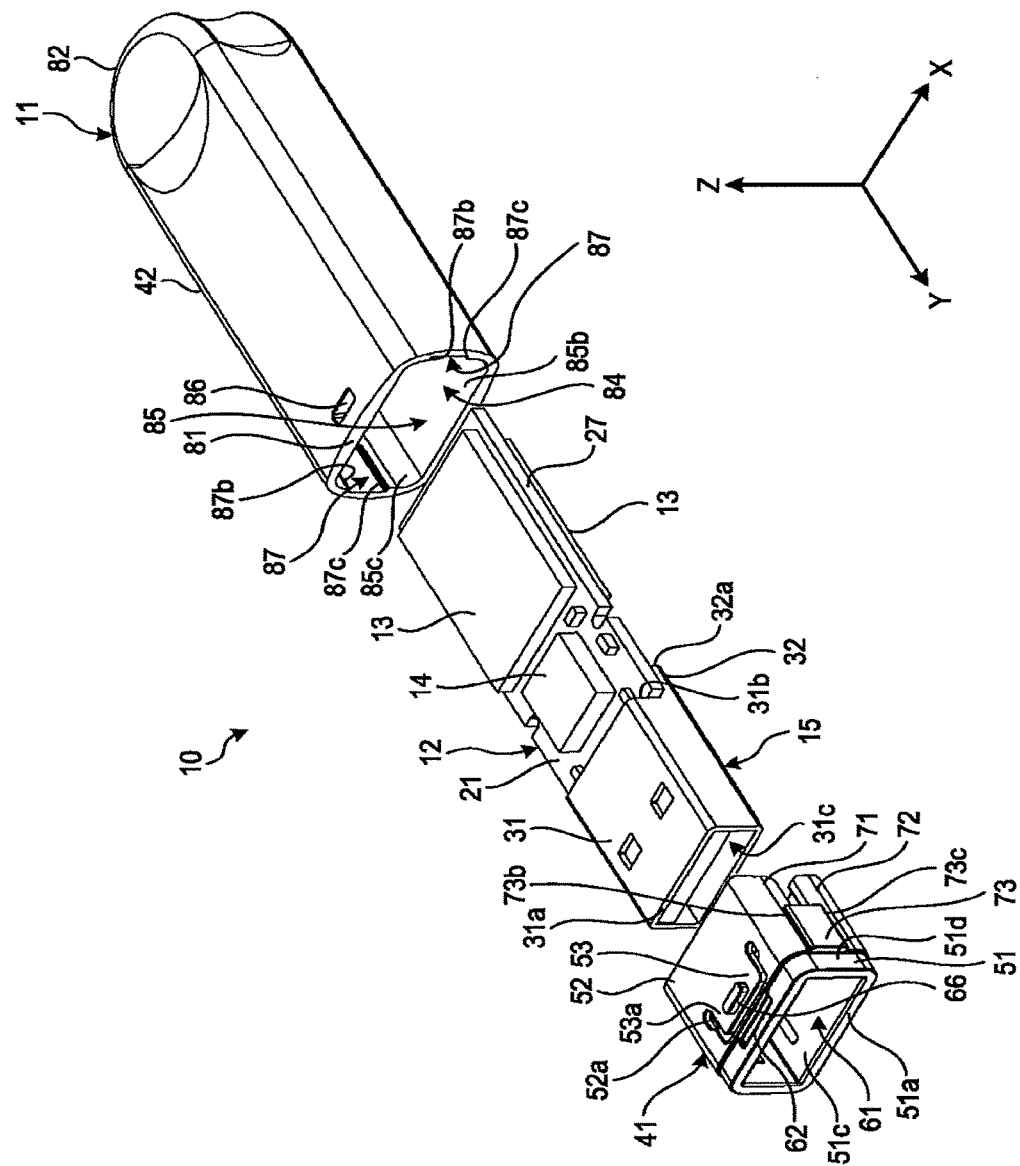
FIG. 2 is an exploded, perspective view of the USB memory according to the first embodiment.

FIG. 1 is a perspective view illustrating a USB flash drive (hereinafter, USB memory) 10 according to a first embodiment. FIG. 2 is an exploded, perspective view of the USB memory 10 according to the first embodiment.

The USB memory 10 is an example of a USB device, and can be referred to as, for example, electronic device, semiconductor memory device, semiconductor device, storage device, secondary storage device, removable medium, or device. The USB device may be, for example, a tablet, a smartphone, a mobile phone, an IC recorder, a household electric machine, a secondary storage device such as a hard disk drive (HDD) or a solid-state drive (SSD), a cable or an adaptor for connecting a device to another device, or other USB devices.

As illustrated in FIG. 1, the USB memory 10 according to the present embodiment has, for example, a substantially rectangular parallelepiped shape. The USB memory 10 can have other shapes. As illustrated in the drawings, an X-axis, a Y-axis, and a Z-axis are defined in the specification. The X-axis, the Y-axis, and the Z-axis are orthogonal to each other. The X-axis is laid along the width of the USB memory 10. The Y-axis is laid along the length of the USB memory 10. The Z-axis is laid along the thickness of the USB memory 10.

As illustrated in FIG. 1 and FIG. 2, the USB memory 10 includes a case 11, a substrate 12, two flash memories 13, a controller 14, and a USB connector 15. The flash memories 13 can be also referred to as, for example, non-volatile memories, memories, storages, or electronic components. The controller 14 is an example of an electronic component and can be referred to as control unit, for example. The USB connector 15 can be referred to as, for example, plug, connection terminal, insertion, or connection.

The case 11 houses therein the substrate 12, the flash memories 13, the controller 14, and a part of the USB connector 15. The USB connector 15 projects from the case 11, and can be covered with, for example, a lid or a cap attachable to the case 11. The case 11 is made from, for example, synthetic resin. The case 11 can be made from other materials.

The substrate 12 is, for example, a printed circuit board (PCB). The substrate 12 can be another substrate such as a flexible printed circuit board (FPC). The substrate 12 is substantially quadrangular (rectangular) plate-like expanding on an X-Y plane. The substrate 12 can have other shapes.

Figure 3:
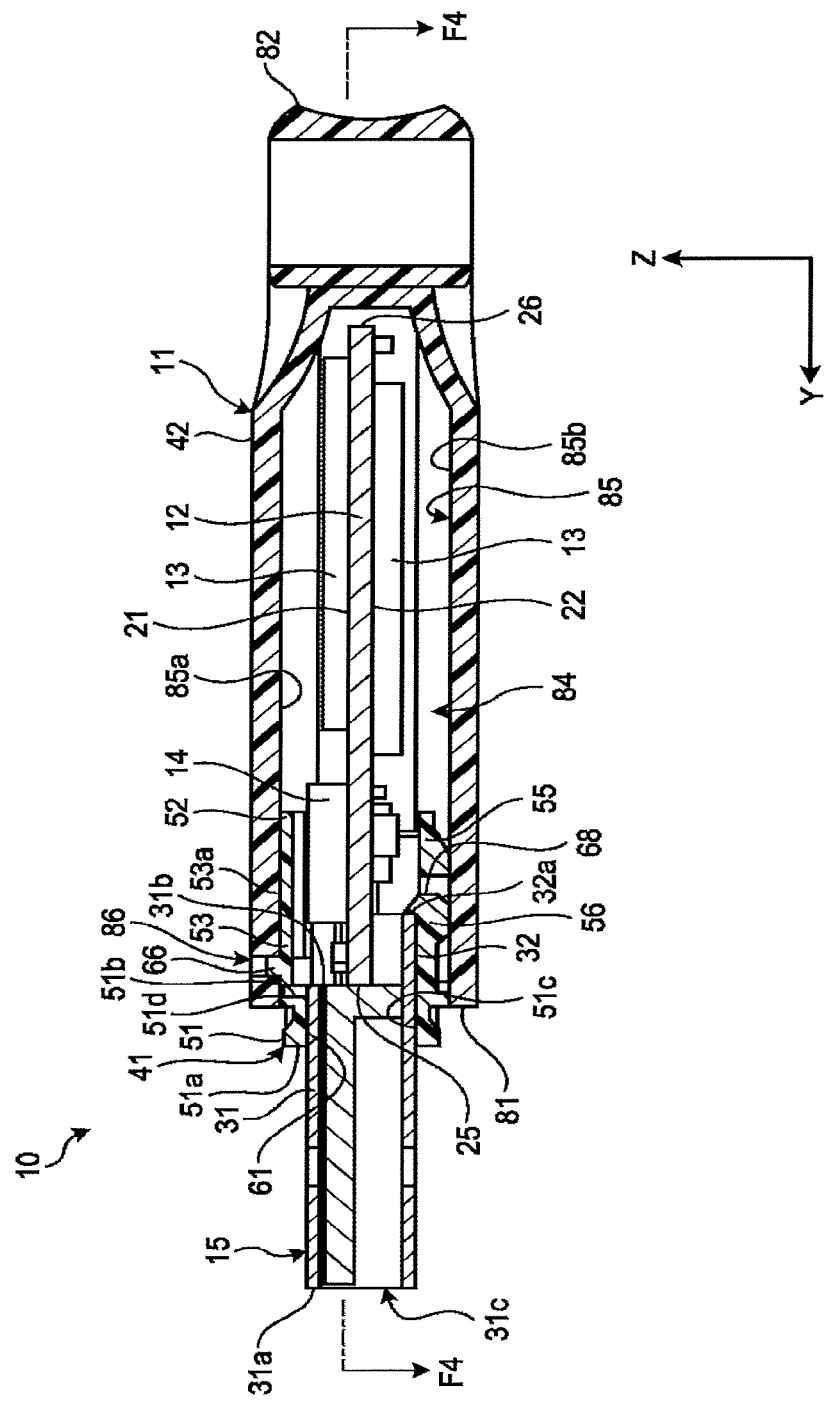
FIG. 3 is a sectional view of the USB memory according to the first embodiment.

FIG. 3 is a sectional view of the USB memory 10 according to the first embodiment. As illustrated in FIG. 3, the substrate 12 has a first mounting face 21 and a second mounting face 22. The first mounting face 21 is an example of a second face. The second mounting face 22 is an example of a third face.

The first mounting face 21 is substantially flat face facing a positive Z-axis direction (a positive direction of the Z-axis, a direction indicated by the arrow of the Z-axis). The second mounting face 22 is substantially flat face facing a negative Z-axis direction (a negative direction of the Z-axis, an opposite direction of the arrow of the Z-axis). The second mounting face 22 is opposite to the first mounting face 21.

Figure 4:
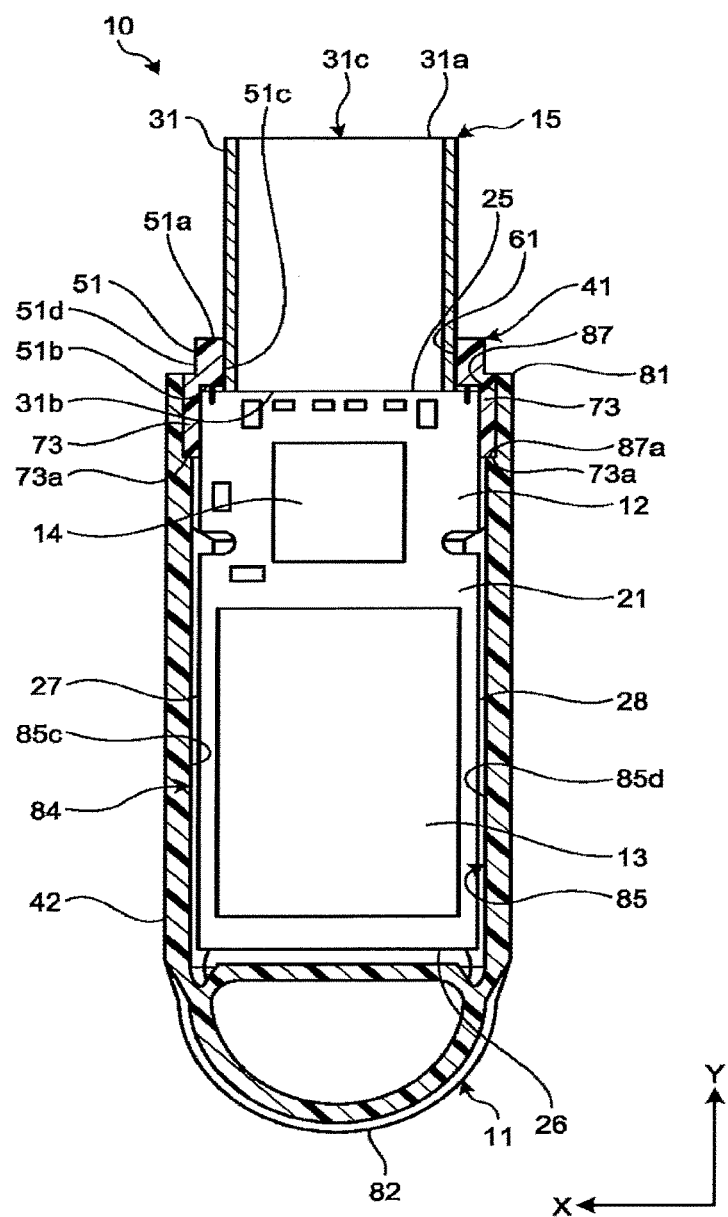
FIG. 4 is a sectional view of the USB memory according to the first embodiment along a line F4-F4 in FIG. 3.

FIG. 4 is a sectional view of the USB memory 10 according to the first embodiment along a line F4-F4 in FIG. 3. As illustrated in FIG. 4, the substrate 12 has a first edge 25, a second edge 26, a first side edge 27, and a second side edge 28. The first edge 25 is an example of a first end. The first edge 25, the second edge 26, the first side edge 27, and the second side edge 28 connect an end of the first mounting face 21 and an end of the second mounting face 22.

The first edge 25 is an end of the substrate 12 facing a positive Y-axis direction (a positive direction of the Y-axis, a direction indicated by the arrow of the Y-axis), and extends in the X-axis direction. The positive Y-axis direction is an example of a first direction. The second edge 26 is an end of the substrate 12 facing a negative Y-axis direction (a negative direction of the Y-axis, an opposite direction of the arrow of the Y-axis). The negative Y-axis direction is opposite to the positive Y-axis direction, and is an example of a second direction. The first edge 25 and the second edge 26 face in the Y-axis direction. The Y-axis direction includes the positive Y-axis direction and the negative Y-axis direction. The second edge 26 is away from the first edge 25 in the negative Y-axis direction and extends in the X-axis direction.

The first side edge 27 is an end of the substrate 12 facing the positive X-axis direction (a positive direction of the X-axis, a direction indicated by the arrow of the X-axis), and extends in the Y-axis direction. The second side edge 28 is an end of the substrate 12 facing the negative X-axis direction (a negative direction of the X-axis, an opposite direction of the arrow of the X-axis). The first side edge 27 and the second side edge 28 face the X-axis direction. The X-axis direction includes the positive X-axis direction and the negative X-axis direction. The second side edge 28 is away from the first side edge 27 in the negative X-axis direction and extends in the Y-axis direction.

The substrate 12 has a substantially rectangular shape extending in the Y-axis direction in a plan view of the first mounting face 21. A distance between the first edge 25 and the second edge 26 in the Y-axis direction is longer than a distance between the first side edge 27 and the second side edge 28 in the X-axis direction.

The first edge 25 and the second edge 26 are short sides of the substrate 12. The first side edge 27 and the second side edge 28 are long sides of the substrate 12. The Y-axis direction can be referred to as a long side direction of the substrate 12. The X-axis direction can be referred to as a short side direction of the substrate 12.

As illustrated in FIG. 3, the two flash memories 13 are mounted on the first mounting face 21 and the second mounting face 22 of the substrate 12. For example, the flash memories 13 are each provided with terminals which are electrically connected to electrodes on the first mounting face 21 and the second mounting face 22 by soldering. The flash memories 13 can be mounted on either of the first mounting face 21 and the second mounting face 22.

The flash memories 13 are NAND flash memories, for example. The USB memory 10 is not limited to a NAND flash memory, and may include other nonvolatile memories such as a NOR flash memory, a Magnetoresistive Random Access Memory (MRAM), a Phase-change Random Access Memory (PRAM), a Resistive Random Access Memory (ReRAM), and a Ferroelectric Random Access Memory (FeRAM).

The controller 14 is mounted on the first mounting face 21 of the substrate 12. For example, the controller 14 is provided with terminals which are electrically connected to the electrodes on the first mounting face 21 by soldering. The controller 14 can be mounted on the second mounting face 22. The controller 14 controls the flash memories 13 to control communication between the USB memory 10 and a host device, for example. The controller 14 is located between the flash memories 13 and the first edge 25 of the substrate 12 in the Y-axis direction.

The USB connector 15 is, for example, a male connector (a plug) conforming to the USB 3.1 Type-A standard or the USB 3.0 Type-A standard. The USB connector 15 has a substantially rectangular parallelepiped shape extending substantially in the Y-axis direction. The USB connector 15 includes an insertion 31 and a mount 32.

The insertion 31 has a substantially rectangular parallelepiped shape extending substantially in the Y-axis direction. The insertion 31 has a first end 31a and a second end 31b. The second end 31b is an example of a second end. The first end 31a is an end of the insertion 31 in the positive Y-axis direction. The second end 31b is an end (edge) of the insertion 31 in the negative Y-axis direction, and is opposite the first end 31a. The second end 31b faces the first edge 25 of the substrate 12.

Figure 5:
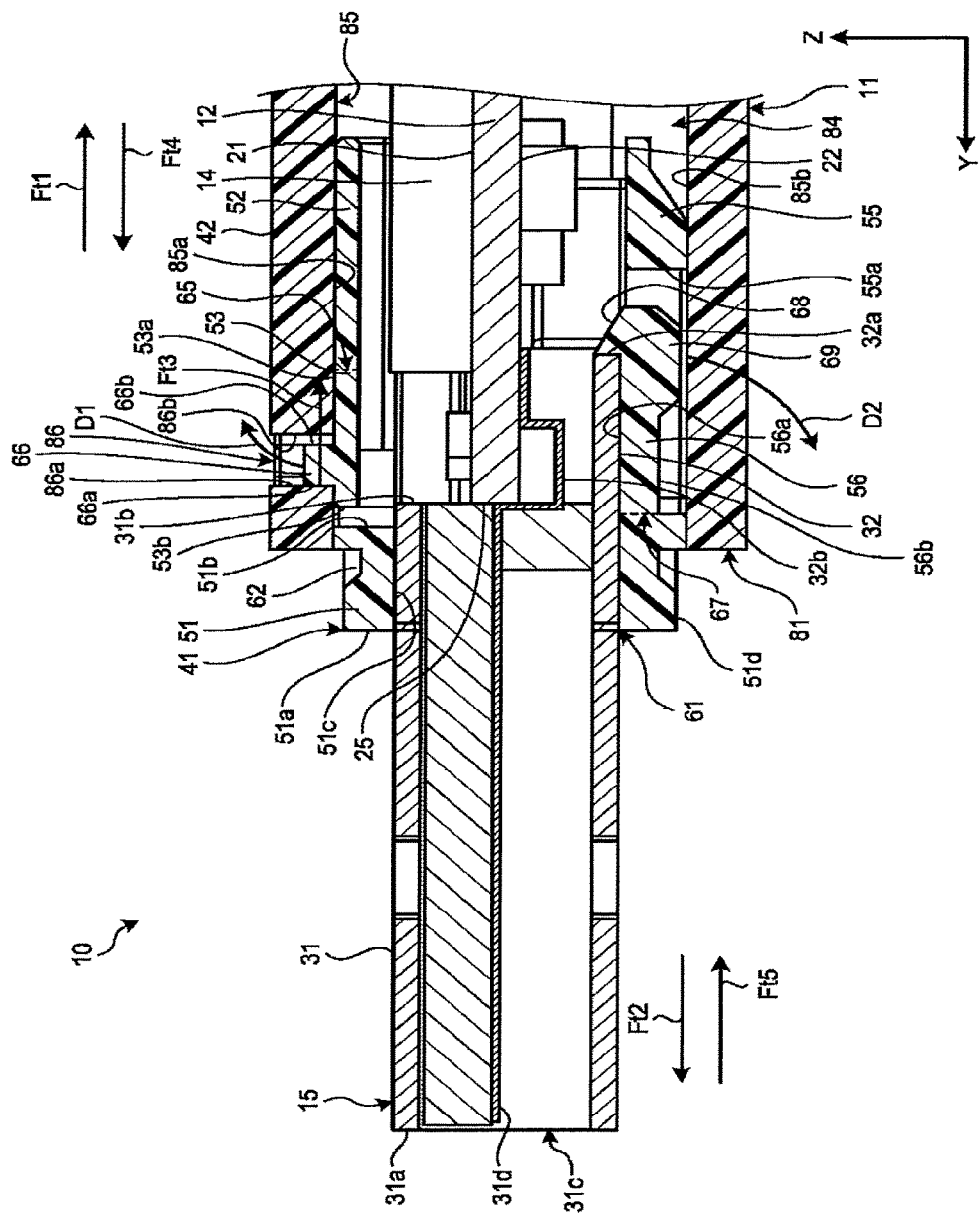
FIG. 5 is an enlarged sectional view of a part of the USB memory according to the first embodiment.

FIG. 5 is an enlarged sectional view illustrating a part of the USB memory 10 according to the first embodiment. As illustrated in FIG. 5, the insertion 31 includes a connection port 31c and connection terminals 31d. The connection port 31c is an opening in the first end 31a. The connection terminals 31d are electrodes located inside the connection port 31c. The insertion 31 includes, for example, eight connection terminals 31d. The insertion 31 of the USB connector 15 conforming to the USB 2.0 standard includes four connection terminals 31d. The number of the connection terminals 31d is not limited to these examples.

The insertion 31 is inserted into, for example, a USB connector (a female connector or a socket) of the host device. A connection terminal of the socket is inserted into the connection port 31c, and electrically connected to the connection terminals 31d. Thus, the USB memory 10 and the host device are electrically connected to each other.

The mount 32 extends from the second end 31b of the insertion 31 in the negative Y-axis direction. The mount 32 covers a part of the second mounting face 22 of the substrate 12. The mount 32 has a tip end 32a. The tip end 32a is an example of a third end.

The tip end 32a is an end of the mount 32 opposite the insertion 31. The tip end 32a is an end (edge) of the USB connector 15 in the negative Y-axis direction. The first end 31a of the insertion 31 is an end (edge) of the USB connector 15 in the positive Y-axis direction.

The mount 32 includes mounting pins 32b. The mounting pins 32b are connected to the connection terminals 31d. The mounting pins 32b are electrically connected to the electrodes on the second mounting face 22 by soldering. That is, the USB connector 15 is mounted on the second mounting face 22 of the substrate 12. The USB connector 15 can be mounted on the first mounting face 21.

In the Z-axis direction, the length (thickness) of the USB connector 15 is longer than the length (thickness) of the substrate 12. Thus, when the USB connector 15 is mounted on the second mounting face 22, a part of the insertion 31 projects from the first mounting face 21 of the substrate 12 in the positive Z-axis direction.

As illustrated in FIG. 2, the case 11 includes an inner casing 41 and an outer casing 42. The inner casing 41 is an example of a holding member. The outer casing 42 is an example of a casing. The inner casing 41 holds the USB connector 15 in the outer casing 42.

As illustrated in FIG. 5, the inner casing 41 includes a holder 51, a first wall 52, a first spring 53, a second wall 55, and a second spring 56. The first wall 52 is an example of a support. The first spring 53 is an example of a first extension. The second spring 56 is an example of a second extension.

The holder 51 has a substantially quadrangular, tubular (frame) shape. The holder 51 includes an outer end 51a, an inner end 51b, an inner periphery 51c, and an outer periphery 51d. The outer end 51a is an example of an end. The outer end 51a is an end of the holder 51 in the positive Y-axis direction. The inner end 51b is an end of the holder 51 in the negative Y-axis direction.

The inner periphery 51c and the outer periphery 51d connect the outer end 51a and the inner end 51b to each other. The inner periphery 51c faces the inside of the tubular holder 51. The outer periphery 51d is opposite the inner periphery 51c, facing the outside of the tubular holder 51.

The holder 51 is provided with an insertion port 61. The insertion port 61 penetrates through the holder 51 in the Y-axis direction and opens to the outer end 51a and the inner end 51b. The insertion port 61 is a substantially quadrangular hole having substantially the same shape as the insertion 31 of the USB connector 15. The shape of the insertion port 61 is not limited thereto.

The insertion 31 of the USB connector 15 projects outside from the case 11 through the insertion port 61. The inner periphery 51c of the holder 51 contacts with the insertion 31, thereby restricting the movement of the USB connector 15 with respect to the inner casing 41 in the X-axis direction and in the Z-axis direction. That is, the inner casing 41 holds the USB connector 15 while the USB connector 15 projects outside through the insertion port 61.

Further, as illustrated in FIG. 4, the inner end 51b of the holder 51 contacts with the first edge 25 of the substrate 12, thereby restricting the movement of the substrate 12 with respect to the inner casing 41 in the positive Y-axis direction. Thus, the inner end 51b of the holder 51 restricts the movement of the USB connector 15 on the substrate 12 with respect to the inner casing 41 in the positive Y-axis direction.

As illustrated in FIG. 5, the holder 51 is provided with depressions 62 in the outer periphery 51d. For example, tabs of the lid are fitted into the depressions 62. Thereby, the lid is detachably attached to the case 11.

The first wall 52 extends from the inner end 51b of the holder 51 in the negative Y-axis direction. The first wall 52 is substantially quadrangular plate-like expanding on the X-Y plane. The shape of the first wall 52 is not limited thereto. The first mounting face 21 of the substrate 12 opposes the first wall 52 with a gap.

Figure 6:
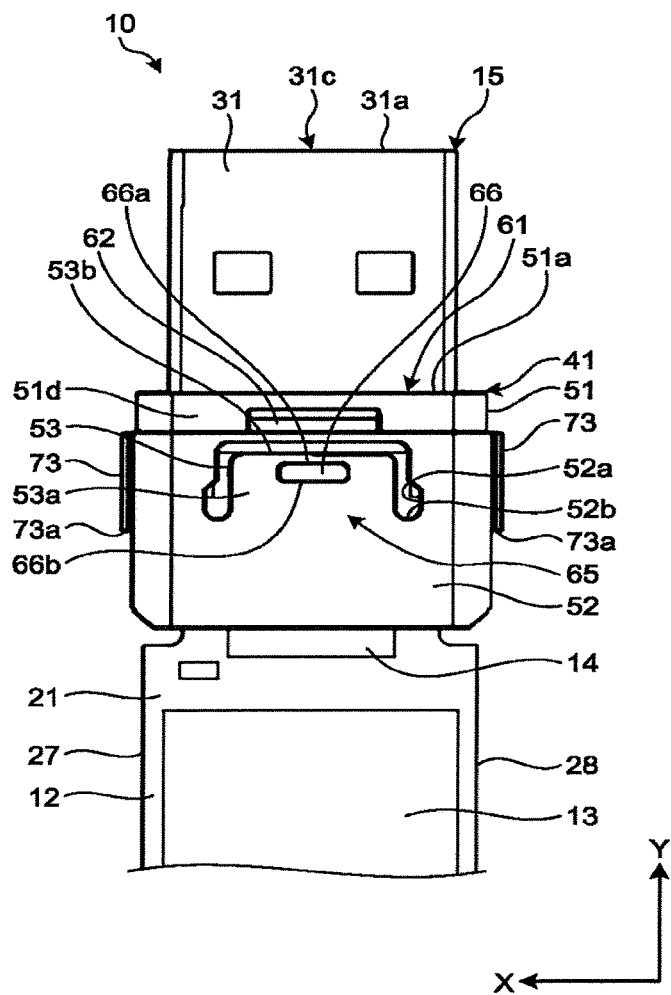
FIG. 6 is a plan view of the USB memory without an outer casing according to the first embodiment.

FIG. 6 is a plan view of the USB memory 10 without the outer casing 42 according to the first embodiment. As illustrated in FIG. 6, the first wall 52 is provided with a first pass-through slot 52a. The first pass-through slot 52a penetrates through the first wall 52 in the Z-axis direction. The first spring 53 is located inside the first pass-through slot 52a, and extends from an inner end 52b of the first wall 52, the inner end 52b defining the first pass-through slot 52a.

The first spring 53 is substantially quadrangular plate-like expanding on the X-Y plane. The shape of the first spring 53 is not limited thereto. The first spring 53 has a surface 53a. The surface 53a is an example of a first face. The surface 53a is substantially flat face facing the positive Z-axis direction. The surface 53a faces oppositely to the substrate 12 and the USB connector 15.

The first spring 53 extends from the first wall 52 in the positive Y-axis direction. The first spring 53 extends toward the holder 51 in a plan view in the negative Z-axis direction. The negative Z-axis direction is oriented to the surface 53a. The direction toward the holder 51 is not limited to the positive Y-axis direction, and may be a diagonal direction including the positive Z-axis direction, such as an upper right direction or an upper left direction in FIG. 6, for example.

The first spring 53 is resiliently bendable around a connection 65 between the first wall 52 and the first spring 53 as a fulcrum (an axis). That is, the first spring 53 can be resiliently bent in a cantilever form at the connection 65 as a fixed end toward or away from the substrate 12.

The first spring 53 further includes a protrusion 66. The protrusion 66 is provided on the surface 53a of the first spring 53 and projects in the positive Z-axis direction. The protrusion 66 has a substantially rectangular parallelepiped shape. The protrusion 66 can have other shapes. The protrusion 66 has a first contact face 66a and a second contact face 66b.

The first contact face 66a is substantially flat face facing the positive Y-axis direction. The second contact face 66b is opposite the first contact face 66a and is substantially flat face facing the negative Y-axis direction. The second contact face 66b can be an inclined face, extending away from the surface 53a as extending in the positive Y-axis direction.

The protrusion 66 is located away from a front end 53b of the first spring 53 in the negative Y-axis direction. The front end 53b is an end of the first spring 53 opposite the connection 65. In other words, the front end 53b is a front end of the extending first spring 53 in a direction in which the first spring portion 53 extends. That is, a part of the surface 53a is located between the protrusion 66 and the front end 53b.

As illustrated in FIG. 5, in the positive Y-axis direction, the front end 53b of the first spring 53 is located between the controller 14 and the second end 31b of the insertion 31 of the USB connector 15. The position of the front end 53b is not limited thereto.

The second wall 55 extends from the inner end 51b of the holder 51 in the negative Y-axis direction. The second wall 55 is substantially quadrangular plate-like expanding on the X-Y plane. The shape of the second wall 55 is not limited thereto. The second mounting face 22 of the substrate 12 opposes the second wall 55 with a gap.

The second wall 55 is provided with a second pass-through slot 55a. The second pass-through slot 55a penetrates through the second wall 55 in the Z-axis direction. The second spring 56 is located inside the second pass-through slot 55a, and extends from the inner end 51b of the holder 51 in the negative Y-axis direction.

The second spring 56 is substantially quadrangular plate-like expanding on the X-Y plane. The shape of the second spring 56 is not limited thereto. The second spring 56 has an inner face 56a and an outer face 56b.

The inner face 56a is substantially flat face facing the positive Z-axis direction. The inner face 56a opposes the substrate 12 with a gap. The inner face 56a faces the mount 32 of the USB connector 15. The outer face 56b is opposite the inner face 56a and is substantially flat face facing the negative Z-axis direction.

The second spring 56 is resiliently bendable around a connection 67 between the holder 51 and the second spring 56 as a fulcrum (an axis). That is, the second spring 56 can be resiliently bent in a cantilever form at the connection 67 being a fixed end toward or away from the substrate 12.

The second spring 56 further includes a tab 68 and ribs 69. The tab 68 is provided on the inner face 56a of the second spring 56, and projects in the Z-axis positive direction. The tab 68 is hooked by the tip end 32a of the mount 32 of the USB connector 15. In other words, the tab 68 faces the tip end 32a. The tab 68 comes into contact with the tip end 32a, thereby restricting the movement of the USB connector 15 with respect to the inner casing 41 in the negative Y-axis direction.

The ribs 69 are provided on the outer face 56b of the second spring 56. The ribs 69 extend in the Y-axis direction. The ribs 69 reinforce the second spring 56, and prevent the second spring 56 from being damaged when the tab 68 is pressed by the tip end 32a of the mount 32 in the negative Y-axis direction.

Figure 7:
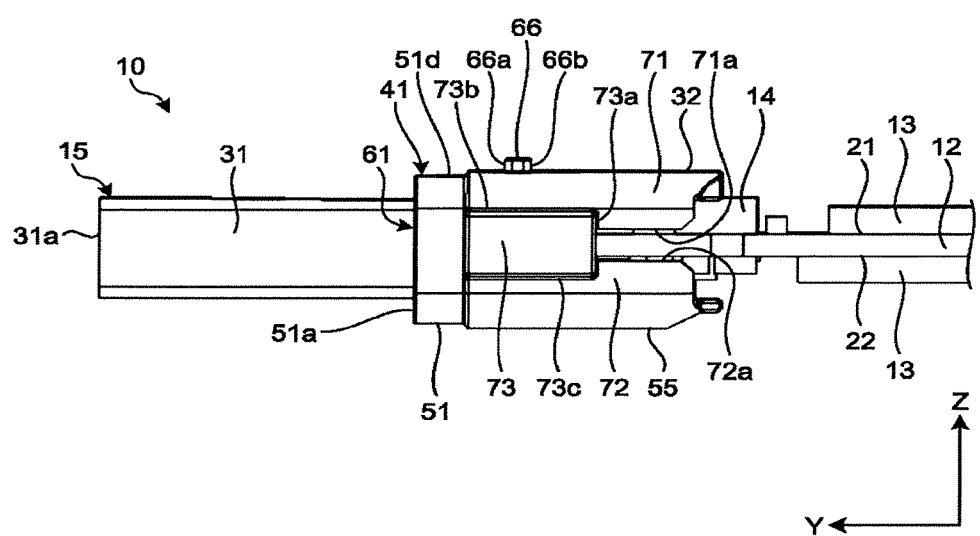
FIG. 7 is a side view of a part of the USB memory without the outer casing according to the first embodiment.

FIG. 7 is a side view of a part of the USB memory 10 without the outer casing 42 according to the first embodiment. As illustrated in FIG. 7, the inner casing 41 further includes first sidewalls 71, second sidewalls 72, and protrusions 73.

The inner casing 41 includes the two first sidewalls 71 extending in the negative Z-axis direction from both X-axial ends of the first wall 52. The first sidewalls 71 each have a first end face 71a. The first end face 71a is an example of a first restrictor. The first end face 71a is an end of the first sidewall 71 in the negative Z-axis direction.

The inner casing 41 has the two second sidewalls 72 extending in the positive Z-axis direction from both X-axial ends of the second wall 55. The second sidewalls 72 each have a second end face 72a. The second end face 72a is an example of a second restrictor. The second end face 72a is an end of the second sidewall 72 in the positive Z-axis direction.

The first end face 71a at least partially faces the first mounting face 21 of the substrate 12. The first end face 71a comes into contact with the first mounting face 21, thereby restricting the movement of the substrate 12 with respect to the inner casing 41 in the positive Z-axis direction.

The second end face 72a at least partially faces the second mounting face 22 of the substrate 12. The second end face 72a comes into contact with the second mounting face 22, thereby restricting the movement of the substrate 12 with respect to the inner casing 41 in the negative Z-axis direction.

The inner casing 41 is provided with the two protrusions 73 that extend in the negative Y-axis direction from both X-axial ends of the inner end 51b of the holder 51. The protrusions 73 connect the first sidewalls 71 and the second sidewalls 72. The protrusions 73 project from the first and second sidewalls 71 and 72 oppositely (outward) to the substrate 12 in the X-axis direction.

The protrusions 73 are substantially rectangular parallelepiped plate-like expanding on a Y-Z plane, and each have a first side end face 73a, a second side end face 73b, and a third side end face 73c. The first side end face 73a is an example of a fourth restrictor.

The first side end face 73a is substantially flat face facing the negative Y-axis direction. The second side end face 73b is substantially flat face facing the positive Z-axis direction. The third side end face 73c is opposite the second side end face 73b and is substantially flat face facing the negative Z-axis direction.

As illustrated in FIG. 2, the outer casing 42 has a cylindrical shape with a closed end, extending in the Y-axis direction. The outer casing 42 can have other shapes. The outer casing 42 has an open end 81 and a closed end 82.

The open end 81 faces in the positive Y-axis direction. The closed end 82 is opposite the open end 81 and faces in the negative Y-axis direction. The outer casing 42 is provided with a port 84 in the open end 81. That is, the port 84 opens in the positive Y-axis direction.

The port 84 is a hole (a hollow) with a bottom, extending from the open end 81 in the negative Y-axis direction. The port 84 may be a through-hole also open in the closed end 82. The port 84 accommodates a part of the inner casing 41, the substrate 12, the flash memories 13, the controller 14, and the mount 32 of the USB connector 15. Thus, the tip end 32a of the mount 32 is located inside the port 84.

As illustrated in FIG. 5, a part of the holder 51 of the inner casing 41 is located outside the port 84. The outer end 51a, a part of the outer periphery 51d, and the depressions 62 in the holder 51 are located outside the port 84. Meanwhile, the first wall 52, the first spring 53, the second wall 55, the second spring 56, the tab 68, the first sidewalls 71, the second sidewalls 72, and the protrusions 73 are located inside the port 84.

As illustrated in FIG. 4 and FIG. 5, the outer casing 42 has an inner periphery 85 that faces the port 84 to define the port 84. The inner periphery 85 includes a first inner face 85a, a second inner face 85b, a third inner face 85c, and a fourth inner face 85d. The first to fourth inner faces 85a, 85b, 85c, and 85d face the port 84 to define a part of the port 84.

The first inner face 85a is substantially flat face facing the negative Z-axis direction. The negative Z-axis direction is an example of a direction intersecting with the first direction. The second inner face 85b is substantially flat face facing the positive Z-axis direction. The second inner face 85b opposes the first inner face 85a with a gap in the Z-axis direction.

The third inner face 85c is substantially flat face facing the negative X-axis direction. The fourth inner face 85d is substantially flat face facing the positive X-axis direction. The fourth inner face 85d opposes the third inner face 85c with a gap in the X-axis direction.

As illustrated in FIG. 5, the first inner face 85a faces a part of the outer periphery 51d of the holder 51, the first wall 52, and the surface 53a of the first spring 53. That is, the first inner face 85a and the surface 53a of the first spring 53 oppose each other. The first inner face 85a, the part of the outer periphery 51d of the holder 51, the first wall 52, and the surface 53a of the first spring 53 can contact with each other or can be slightly away from each other.

The first mounting face 21 of the substrate 12 faces the first inner face 85a. In the Z-axis direction, a distance between the first inner face 85a and the first mounting face 21 is longer than a distance between the first end face 71a of the first sidewall 71 and the first mounting face 21. Thus, the first end face 71a is closer to the first mounting face 21 than the first inner face 85a, facing the first mounting face 21.

The second inner face 85b faces a part of the outer periphery 51d of the holder 51, the second wall 55, and the ribs 69 of the second spring 56. The second inner face 85b and the outer face 56b of the second spring 56 oppose each other. The second inner face 85b, a part of the outer periphery 51d of the holder 51, the second wall 55, and the ribs 69 can contact with each other or can be slightly away from each other.

The second inner face 85b faces the second mounting face 22 of the substrate 12. In the Z-axis direction, a distance between the second inner face 85b and the second mounting face 22 is longer than a distance between the second end face 72a of the second sidewall 72 and the second mounting face 22. Thus, the second end face 72a is closer to the second mounting face 22 than the second inner face 85b, facing the second mounting face 22.

The third inner face 85c and the fourth inner face 85d face a part of the outer periphery 51d of the holder 51, the first sidewall 71, the second sidewall 72, and the protrusions 73. The third inner face 85c and the fourth inner face 85d, a part of the outer periphery 51d of the holder 51, the first sidewall 71, the second sidewall 72, and the protrusions 73 can contact with each other or can be slightly away from each other.

The first to fourth inner faces 85a, 85b, 85c, and 85d come into contact with the outer periphery 51d of the holder 51, thereby restricting the movement of the inner casing 41 with respect to the outer casing 42 in the X-axis direction and the Z-axis direction.

The outer casing 42 is provided with an opening 86. The opening 86 is, for example, a through-hole, and opens in the first inner face 85a. The opening 86 can be a hole with a bottom that opens in the first inner face 85a.

The opening 86 is larger than the protrusion 66. When a part of the inner casing 41 is housed in the port 84, the protrusion 66 enters the opening 86. In other words, the protrusion 66 is housed in the opening 86. With the protrusion 66 housed in the opening 86, the surface 53a of the first spring 53 extends along the first inner face 85a. The surface 53a of the first spring 53 can contact with the first inner face 85a or can be slightly away from the first inner face 85a.

The outer casing 42 has a first receiving face 86a and a second receiving face 86b. The first receiving face 86a and the second receiving face 86b are inner faces of the opening 86. The first receiving face 86a is substantially flat face facing the negative Y-axis direction. The second receiving face 86b is substantially flat face facing the positive Y-axis direction and opposes the first receiving face 86a.

With the protrusion 66 housed in the opening 86, the first receiving face 86a opposes the first contact face 66a of the protrusion 66. The second receiving face 86b opposes the second contact face 66b of the protrusion 66. The first receiving face 86a and the second receiving face 86b, and the first contact face 66a and the second contact face 66b can contact with each other or can be slightly away from each other.

When the protrusion 66 is housed in the opening 86, the first spring 53 with the protrusion 66 restricts the inner casing 41 from moving with respect to the outer casing 42 in the positive and negative Y-axis directions. That is, the first contact face 66a of the protrusion 66 contacts with the first receiving face 86a of the opening 86, thereby restricting the inner casing 41 from moving in the positive Y-axis direction with respect to the outer casing 42. Further, by the contact between the second contact face 66b of the protrusion 66 and the second receiving face 86b of the opening 86, the inner casing 41 is restricted from moving in the negative Y-axis direction with respect to the outer casing 42.

As illustrated in FIG. 2 and FIG. 4, the third inner face 85c and the fourth inner face 85d are each provided with a recess 87. The recess 87 is substantially quadrangular indentation. The recess 87 has a first internal face 87a, a second internal face 87b, and a third internal face 87c. The first internal face 87a is an example of a third restrictor. The first to third internal faces 87a, 87b, and 87c are located inside the port 84.

The first internal face 87a is substantially flat face facing the positive Y-axis direction. The second internal face 87b is substantially flat face facing the negative Z-axis direction.

The third internal face 87c is substantially flat face facing the positive Z-axis direction, and opposes the second internal face 87b.

The protrusion 73 of the inner casing 41 is housed in the recess 87. The first side end face 73a of the protrusion 73 faces the first internal face 87a. The second side end face 73b faces the second internal face 87b. The third side end face 73c faces the third internal face 87c.

The first side end face 73a comes into contact with the first internal face 87a, thereby restricting the movement of the inner casing 41 with respect to the outer casing 42 in the negative Y-axis direction, that is, restricting the movement of the inner casing 41 toward the inside of the port 84 with respect to the outer casing 42.

The second side end face 73b comes into contact with the second internal surface 87b, thereby restricting the movement of the inner casing 41 with respect to the outer casing 42 in the positive Z-axis direction. The third side end face 73c comes into contact with the third internal face 87c, thereby restricting the movement of the inner casing 41 with respect to the outer casing 42 in the negative Z-axis direction.

As illustrated in FIG. 6, the connection 65 between the first wall 52 and the first spring 53 is located within an area in which the protrusion 73 is provided in the Y-axis direction. Thus, the protrusion 73 reinforces the inner casing 41 to protect the first wall 52 and the first spring 53 from being damaged by the first spring 53 when bent around the connection 65.

Figure 8:
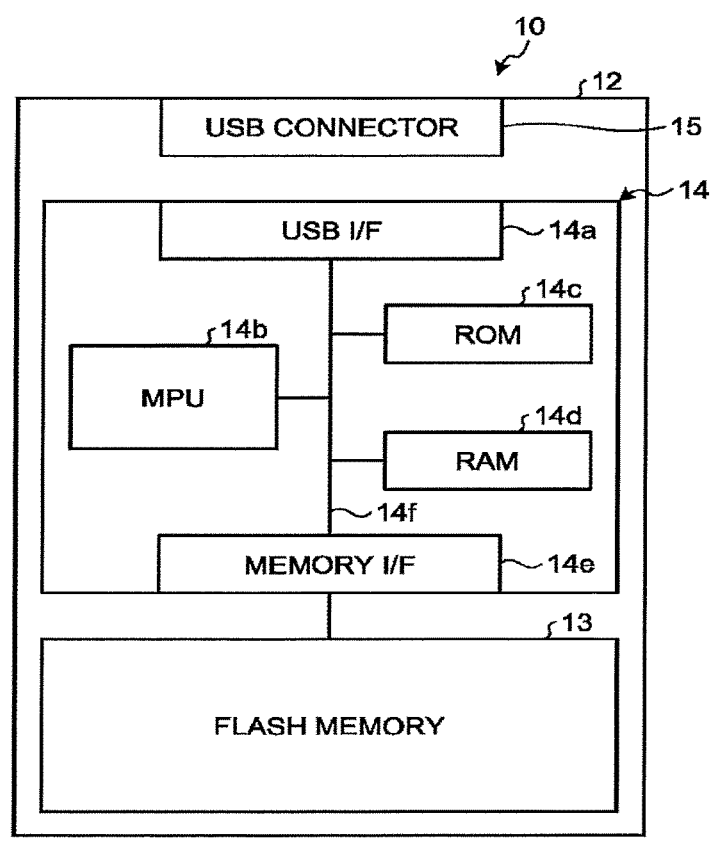
FIG. 8 is a block diagram illustrating an example of a configuration of the USB memory according to the first embodiment.

FIG. 8 is a block diagram illustrating an exemplary configuration of the USB memory 10 according to the first embodiment. As illustrated in FIG. 8, the controller 14 controls transmission of data between the USB connector 15 and the flash memory 13.

The controller 14 includes a USB interface (I/F) 14a, an MPU 14b, a ROM 14c, a RAM 14d, a memory interface (I/F) 14e, and an internal bus 14f. The USB I/F 14a, the MPU 14b, the ROM 14c, the RAM 14d, the memory I/F 14e, and the internal bus 14f are formed on, for example, one semiconductor substrate.

The USB I/F 14a receives data and a command from a host device via the USB connector 15. The data and the command are written in, for example, a Small Computer System Interface (SCSI) standard format. The USB I/F 14a receives data from the flash memory 13 and outputs the data in the SCSI standard format to the host device via the USB connector 15.

The MPU 14b processes the command received from the host device and the data received from the flash memory 13 using, for example, the ROM 14c and the RAM 14d. Further, the MPU 14b performs authentication between the host device and the USB memory 10 when the USB memory 10 is connected to the host device.

The ROM 14c holds data and programs for the processing by the MPU 14b. The RAM 14d functions as a work area for the processing by the MPU 14b. The RAM 14d is, for example, a volatile semiconductor memory such as a DRAM.

The memory I/F 14e is connected to the flash memory 13, for example, through wirings. The memory I/F 14e transfers the command and the data from the USB I/F 14a to the flash memory 13 and transfers the read data from the flash memory 13 to the USB I/F 14a according to instructions from the MPU 14b.

The flash memory 13 receives a read command from the controller 14 to read data for output. The flash memory 13 receives a write command from the controller 14 to record the data.

When the USB connector 15 of the above USB memory 10 is extracted, for example, from a socket of the host device, a tensile force Ft1, indicated by the arrow in FIG. 5, acts on the outer casing 42. For example, the tensile force Ft1 acts on the outer casing 42 when manually pulled by a user.

When the outer casing 42 is pulled with the tensile force Ft1, a tensile force (resistance) Ft2 acts on the USB connector 15 held in the socket. The tensile force Ft2 acting on the USB connector 15 also acts on the inner casing 41.

The tensile forces Ft1 and Ft2 cause the USB connector 15 and the inner casing 41 to move in the positive Y-axis direction with respect to the outer casing 42. In other words, the USB connector 15 and the inner casing 41 are to be pulled out from the port 84 of the outer casing 42. However, the first receiving face 86a of the opening 86 comes into contact with the first contact face 66a of the protrusion 66 to generate a pressing force Ft3 thereon.

As described above, the first spring 53 extends from the first wall 52 in the positive Y-axis direction. In other words, the first spring 53 extends from the first wall 52 in a direction toward the outer end 51a of the holder 51 along the first inner face 85a. The extended first spring 53 is resiliently bendable around the connection 65 as a fulcrum.

The direction of the pressing force Ft3 is different from the direction toward the connection 65. Thus, the pressing force Ft3 causes the first spring 53 to rotate in a direction D1 around the connection 65 as a fulcrum. That is, the pressing force Ft3 causes torque to act on the first spring 53.

The direction D1 is a direction in which the first spring 53 approaches the first inner face 85a of the port 84. Thus, the protrusion 66 is to enter the opening 86 further deeply. Also, the surface 53a of the first spring 53 is pressed onto the first inner face 85a of the port 84. Because the first inner face 85a receives the surface 53a, deformation of the first spring 53 is prevented.

As described above, with the occurrence of the tensile forces Ft1 and Ft2 that pull out the inner casing 41 from the port 84, the first spring 53 is bent oppositely to the direction in which the protrusion 66 is pulled out from the opening 86. Thereby, the protrusion 66 is prevented from being pulled out from the opening 86, which restricts the inner casing 41 from moving with respect to the outer casing 42 in the positive Y-axis direction.

Further, as described above, the inner end 51b of the holder 51 illustrated in FIG. 4 faces the first edge 25 of the substrate 12. The inner end 51b of the holder 51 comes into contact with the first edge 25, thereby restricting the movement of the substrate 12 with respect to the inner casing 41 in the positive Y-axis direction. This can restrict the USB connector 15 on the substrate 12 from moving with respect to the inner casing 41 in the positive Y-axis direction.

Meanwhile, at the time of inserting the USB connector 15 of the USB memory 10 into the socket, a pressing force Ft4, as illustrated by the arrow in FIG. 5, acts on the outer casing 42. For example, the pressing force Ft4 acts on the outer casing 42 when pressed manually by a user.

When the outer casing 42 is pressed with the pressing force Ft4, a pressing force (resistance) Ft5 acts on the USB connector 15 inserted into the socket. The pressing force Ft5 acting on the USB connector 15 also acts on the inner casing 41.

The pressing forces Ft4 and Ft5 cause the USB connector 15 and the inner casing 41 to move in the negative Y-axis direction with respect to the outer casing 42. In other words, the USB connector 15 and the inner casing 41 move toward the inside of the port 84 of the outer casing 42. Then, the first side end face 73a of the protrusion 73 illustrated in FIG. 4 comes into contact with the first internal face 87a of the recess 87.

As described above, by the contact between the first side end face 73a and the first internal face 87a, the inner casing 41 can be restricted from moving with respect to the outer casing 42 in the negative Y-axis direction, that is, from moving toward the inside of the port 84 of the outer casing 42.

As described above, the tab 68 illustrated in FIG. 5 contacts with the tip end 32a of the USB connector 15, to restrict the movement of the USB connector 15 with respect to the inner casing 41 in the negative Y-axis direction. Then, the pressing force Ft5 acts on the tab 68 via the USB connector 15.

The second spring 56 is resiliently bendable around the connection 67 as a fulcrum. Because of this, the pressing force Ft5 causes the second spring 56 to rotate in a direction D2 around the connection 67.

The direction D2 is a direction in which the second spring 56 approaches the second inner face 85b of the port 84. In other words, the direction D2 is a direction in which the tab 68 comes off from the tip end 32a. However, in the positive Z-axis direction, the distance between the second spring 56 and the second inner face 85b is shorter than the distance between the tab 68 and the tip end 32a of the mount 32 of the USB connector 15 opposing each other. By contacting the second inner face 85b at the ribs 69, the second spring 56 can be inhibited from being bent in the direction D2, maintaining the tab 68 in a hooked state by the tip end 32a.

In the USB memory 10 according to the first embodiment described above, the first spring 53 extends along the first inner face 85a in a direction toward the outer end 51a of the inner casing 41 from the first wall 52 of the inner casing 41 inside the port 84. When the inner casing 41 receives a pressing force to outside the port 84, the pressing force Ft3 acts on the contact between the protrusion 66 and the opening 86. The pressing force Ft3 causes the first spring 53 to bend in the direction D1 toward the first inner face 85a around the connection 65 between the first wall 52 and the first spring 53 as a fulcrum. This prevents the protrusion 66 and the opening 86 from being disengaged, inhibiting the inner casing 41 from coming off from the outer casing 42.

The protrusion 66 is spaced apart from the front end 53b of the first spring 53 in the positive Y-axis direction. When the inner casing 41 receives a pressing force to outside the port 84, the pressing force Ft3 acts on the contact between the protrusion 66 and the opening 86. The pressing force Ft3 causes the first spring 53 to bend in the direction D1 toward the first inner face 85a around the connection 65 between the first wall 52 and the first spring 53 as a fulcrum. A part of the surface 53a is then pressed onto the first inner face 85a, increasing the friction force therebetween and inhibiting the first spring 53 from bending. Thus, the first spring 53 is prevented from being broken or damaged and the inner casing 41 is prevented from coming off from the outer casing 42.

In the positive Y-axis direction, the front end 53b of the first spring 53 is located between the controller 14 and the second end 31b of the USB connector 15. For example, in attaching the inner casing 41 to the outer casing 42, the first spring 53 is resiliently bent toward the substrate 12 around the connection 65 between the first wall 52 and the first spring 53 as a fulcrum. The front end 53b of the first spring 53 then enters between the controller 14 and the second end 31b of the USB connector 15. Thereby, the bent first spring 53 is prevented from contacting and damaging the USB connector 15 and the controller 14. Further, the circumference of the first edge 25 facing the second end 31b may become a dead space with no electronic components and wirings. However, in the present embodiment, the dead space is effectively used as a space for the first spring 53 to retract.

The first inner face 85a can be an inclined face being further away from the substrate 12 as extending to the open end 81. In this case, for example, when attaching the inner casing 41 to the outer casing 42, the inclined first inner face 85a presses down the protrusion 66, and the first spring 53 is resiliently bent toward the substrate 12. Thereby, the inner casing 41 can be easily attached to the outer casing 42.

The first end face 71a of the first sidewall 71 is closer to the first mounting face 21 of the substrate 12 than the first inner face 85a and faces the first mounting face 21. The second end face 72a of the second sidewall 72 is closer to the second mounting face 22 than the second inner face 85b and faces the second mounting face 22. Thus, the first end face 71a comes into contact with the first mounting face 21 to restrict the substrate 12 from moving in the direction of the first mounting face 21 with respect to the inner casing 41. The second end face 72a comes into contact with the second mounting face 22 to restrict the substrate 12 from moving in the direction of the second mounting face 22 with respect to the inner casing 41. Thereby, the substrate 12 and the USB connector 15 are restricted from moving with respect to the inner casing 41 in the thickness direction of the substrate 12.

The inner casing 41 faces the first edge 25 of the substrate 12 on which the USB connector 15 is mounted. This restricts the movement of the substrate 12 and the USB connector 15 with respect to the inner casing 41 in the positive Y-axis direction. Further, the tab 68 of the second spring 56 faces the tip end 32a of the USB connector 15. By contacting the tip end 32a, the tab 68 restricts the movement of the USB connector 15 with respect to the inner casing 41 in the negative Y-axis direction. Thereby, when inserting the USB connector 15 into the socket or pulling the USB connector 15 out of the socket, the USB connector 15 can be prevented from coming off from the inner casing 41.

For example, when attaching the USB connector 15 to the socket, the second spring 56 is to be bent around the connection 67 between the holder 51 and the second spring 56 as a fulcrum in the direction D2 in which the tab 68 comes off from the tip end 32a. However, in the Z-axis positive direction, the distance between the second spring portion 56 and the second inner face 85b is shorter than the distance between the tab 68 and the tip end 32a opposing each other. Because of this, by contacting with the second inner face 85b, the second spring 56 is restricted from bending in the direction D2. This can prevent the USB connector 15 from coming off from the inner casing 41 without failure.

When the inner casing 41 receives a pressing force to inside the port 84, the force may act on the contact between the second contact face 66b of the protrusion 66 and the second receiving face 86b of the opening 86. The force causes the first spring 53 to bend away from the first inner face 85a around the connection 65 between the holder 51 and the first spring 53 as a fulcrum. However, the protrusion 73 of the inner casing 41 is housed in the recess 87 of the outer casing 42, and the first side end face 73a of the protrusion 73 faces the first internal face 87a of the recess 87. By contacting with the first internal face 87a, the first side end face 73a restricts the movement of the inner casing 41 with respect to the outer casing 42 in the negative Y-axis direction. This can prevent the protrusion 66 and the opening 86 from being disengaged, inhibiting the inner casing 41 from coming off from the outer casing 42.

In the first embodiment, the inner casing 41 includes the protrusions 73 and the outer casing 42 is provided with the recesses 87. However, the inner casing 41 may be provided with recesses and the outer casing 42 may include protrusions in the inner periphery 85. In this case, the protrusions are to be housed in the recesses while a part of the protrusions facing the positive Y-axis direction (an example of the third restrictor) and a part of the recesses facing the negative Y-axis direction (an example of the fourth restrictor) oppose each other. By the contact between the protrusions and the recesses, the inner casing 41 is restricted from moving with respect to the outer casing 42 in the negative Y-axis direction. This can prevent the protrusion 66 and the opening 86 from being disengaged, inhibiting the inner casing 41 from coming off from the outer casing 42.

As described above, the inner casing 41 restricts the USB connector 15 and the substrate 12 from moving with respect to the inner casing 41 in the X-axis direction, in the Y-axis direction, and in the Z-axis direction. This eliminates the necessity for the outer casing 42 to hold the USB connector 15 and the substrate 12, improving the degree of freedom of the shape of the outer casing 42. Further, even if the design of the outer casing 42 is changed, a performance evaluation test of the inner casing 41 can be at least partially omitted, thereby curtailing an increase in the development cost of the USB connector 15.

Second Embodiment

A second embodiment is described below with reference to FIG. 9. In the following, constituent elements having same or like functions as those of the constituent elements described above may be denoted by the same reference numerals, and descriptions thereof may be omitted. Further, the constituent elements denoted by the same reference numerals do not necessarily have the same functions and characteristics, and these constituent elements may have mutually different functions and characteristics according to respective embodiments.

Figure 9:
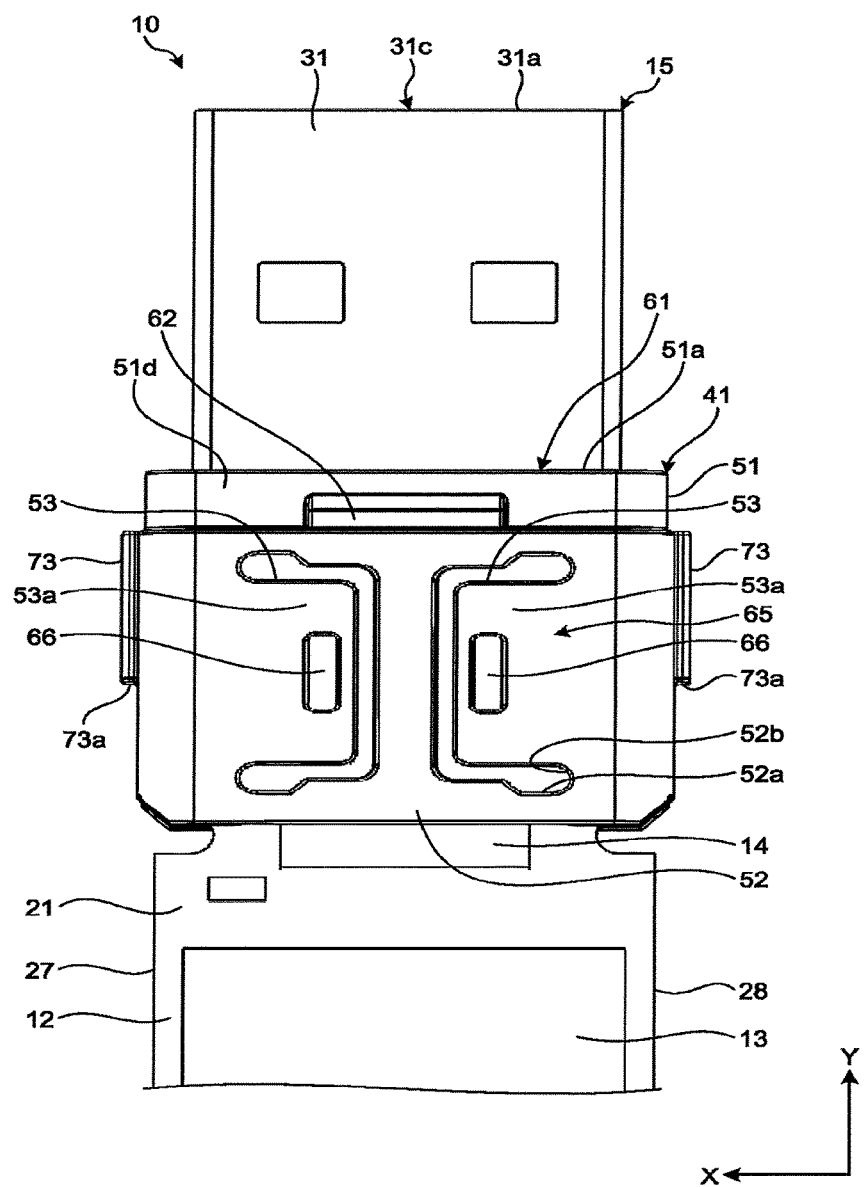
FIG. 9 is a plan view of a USB memory without an outer casing according to a second embodiment.

FIG. 9 is a plan view of the USB memory 10 according to the second embodiment, excluding the outer casing 42. As illustrated in FIG. 9, the inner casing 41 according to the second embodiment includes two first springs 53 and two protrusions 66.

The two first springs 53 each extend from the first wall 52 along the first inner face 85a in a direction orthogonal to the positive Y-axis direction. For example, one of the first springs 53 extends from the first wall 52 in the positive X-axis direction. The other of the first springs 53 extends from the first wall 52 in the negative X-axis direction.

The two protrusions 66 project from the surfaces 53a of the two first springs 53. The two protrusions 66 are housed in the two openings 86 in the outer casing 42. Because of the protrusions 66 housed in the openings 86, the first springs 53 with the protrusions 66 restrict the movement of the inner casing 41 with respect to the outer casing 42 in the positive and negative Y-axis directions.

According to the second embodiment, when pulling out the USB connector 15 of the USB memory 10 from the socket, a tensile force acts on the outer casing 42. The tensile force causes the USB connector 15 and the inner casing 41 to move in the positive Y-axis direction with respect to the outer casing 42. However, the opening 86 comes into contact with the protrusions 66, generating a twisting force to the first springs 53.

The twisting force causes a part of the surfaces 53a on the positive Y-axis side to be twisted and approach the first inner face 85a of the port 84. This presses the protrusions 66 further into the openings 86. Further, the surfaces 53a of the first springs 53 are pressed onto the first inner face 85a of the port 84. Because the first inner face 85a receives the surfaces 53a, deformation of the first springs 53 is prevented.

As described above, when the tensile force occurs on the inner casing 41, pulling it out from the port 84, the first spring 53 bends in a direction different from the direction in which the protrusions 66 come off from the openings 86. This can prevent the protrusions 66 from coming off from the openings 86 and restrict the inner casing 41 from moving with respect to the outer casing 42 in the positive Y-axis direction.

For example, to pull out the USB memory 10 from the socket, a user may apply a rotational (twisting) force around the Y-axis to the outer casing 42. In the present embodiment, because the USB memory 10 includes the two first springs 53, one extending in the positive X-axis direction and the other extending in the negative X-axis direction, the protrusions 66 can be prevented from coming off from the openings 86 when the outer casing 42 is twisted.

In the USB memory 10 of the second embodiment described above, the first springs 53 extend from the first wall 52 of the inner casing 41 inside the port 84 along the first inner face 85a in the direction orthogonal to the positive Y-axis direction. When the inner casing 41 receives a pressing force to outside the port 84, the force acts on the contact between the protrusions 66 and the openings 86. The force causes the first springs 53 to be twisted. This can prevent the protrusions 66 and the openings 86 from being disengaged, preventing the inner casing 41 from coming off from the outer casing 42.

According to at least one of the above embodiments, at least a part of a holding member that holds a USB connector is housed in a port that opens in a first direction, and a first extension provided with a protrusion extends in a direction toward an end of the holding member or in a direction orthogonal to the first direction. Thereby, the holding member is prevented from coming off from a casing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A USB device comprising:
a USB connector;
a casing provided with a port that opens in a first direction, the casing having a first inner face that is provided with an opening, faces a direction intersecting with the first direction, and faces the port; and
a holding member including a holder, a support, and a first extension, wherein the holder is at least partially housed in the port, includes an end outside the port, and is provided with an insertion port that opens in the end, and the holder holds the USB connector while the USB connector projects outward through the insertion port,
the support extends from the holder inside the port,
the first extension includes a first face facing the first inner face and a protrusion on the first face,
the first extension extends inside the port from the support along the first inner face in a direction toward the end or in a direction orthogonal to the first direction, the first extension being bendable, and
the protrusion is housed in the opening.

2. The USB device according to claim 1, wherein
the first extension extends from the support along the first inner face toward the end, and
the protrusion is spaced apart from a tip end of the first extension in an extending direction of the first extension.

3. The USB device according to claim 2, further comprising:
a substrate on which the USB connector is mounted, the substrate at least partially housed in the casing, including a second face facing the first inner face and a first end facing the first direction; and
an electronic component mounted on the second face, wherein
the first extension extends from the support along the first inner face toward the end,
the USB connector has a second end opposing the first end, and
the tip end of the first extension is located between the electronic component and the second end in the first direction.

4. The USB device according to claim 3, wherein
the substrate has a third face opposite the second face,
the casing includes a second inner face facing the port and the third face, and
the holding member includes a first restrictor and a second restrictor, the first restrictor being closer to the second face than the first inner face and facing the second face, the second restrictor being closer to the third face than the second inner face and facing the third face.

5. The USB device according to claim 4, wherein
the holding member further includes a second extension extending from the holder, and faces the first end of the substrate,
the USB connector includes a third end in a second direction opposite to the first direction,
the third end is located inside the port, and
the second extension includes a tab facing the third end.

6. The USB device according to claim 5, wherein
the second inner face faces the second extension, and
a distance between the second extension and the second inner face is shorter than a distance between the tab and the third end in a direction where the second inner face faces.

7. The USB device according to claim 6, wherein
the casing includes an inner periphery including the first inner face and facing the port,
the inner periphery is provided with one of a protrusion and a recess,
the holding member is provided with the other of the protrusion and the recess,
the protrusion is housed in the recess,
the one of the protrusion and the recess includes a third restrictor facing the first direction, and the other of the protrusion and the recess includes a fourth restrictor facing the second direction and facing the third restrictor.

8. The USB device according to claim 5, wherein
the casing includes an inner periphery including the first inner face and facing the port,
the inner periphery is provided with one of a protrusion and a recess,
the holding member is provided with the other of the protrusion and the recess,
the protrusion is housed in the recess,
the one of the protrusion and the recess includes a third restrictor facing the first direction, and
the other of the protrusion and the recess includes a fourth restrictor facing the second direction and facing the third restrictor.

9. The USB device according to claim 2, wherein in an extending direction of the first extension, the protrusion is further away from a connection between the protrusion and the support than from a tip end of the first extension.

10. The USB device according to claim 1, further comprising:
a substrate on which the USB connector is mounted, the substrate at least partially housed in the casing, including a second face facing the first inner face and a first end facing the first direction; and
an electronic component mounted on the second face, wherein
the first extension extends from the support along the first inner face toward the end,
the USB connector has a second end opposing the first end, and
a tip end of the first extension is located between the electronic component and the second end in the first direction.

11. The USB device according to claim 10, wherein
the substrate has a third face opposite the second face,
the casing includes a second inner face facing the port and the third face, and
the holding member includes a first restrictor and a second restrictor, the first restrictor being closer to the second face than the first inner face and facing the second face, the second restrictor being closer to the third face than the second inner face and facing the third face.

12. The USB device according to claim 11, wherein
the holding member further includes a second extension extending from the holder, and faces the first end of the substrate,
the USB connector includes a third end in a second direction opposite to the first direction,
the third end is located inside the port, and
the second extension includes a tab facing the third end.

13. The USB device according to claim 12, wherein
the second inner face faces the second extension, and
a distance between the second extension and the second inner face is shorter than a distance between the tab and the third end in a direction where the second inner face faces.

14. The USB device according to claim 13, wherein
the casing includes an inner periphery including the first inner face and facing the port,
the inner periphery is provided with one of a protrusion and a recess,
the holding member is provided with the other of the protrusion and the recess,
the protrusion is housed in the recess,
the one of the protrusion and the recess includes a third restrictor facing the first direction, and
the other of the protrusion and the recess includes a fourth restrictor facing the second direction and facing the third restrictor.

15. The USB device according to claim 12, wherein
the casing includes an inner periphery including the first inner face and facing the port,
the inner periphery is provided with one of a protrusion and a recess,
the holding member is provided with the other of the protrusion and the recess,
the protrusion is housed in the recess,
the one of the protrusion and the recess includes a third restrictor facing the first direction, and
the other of the protrusion and the recess includes a fourth restrictor facing the second direction and facing the third restrictor.

16. The USB device according to claim 10, wherein
the substrate includes a third face opposite the second face, and
the USB connector is mounted on the third face.

17. The USB device according to claim 10, further comprising a flash memory mounted on the substrate, wherein
the electronic component includes a controller that controls the flash memory.

18. The USB device according to claim 1, wherein a depth of the opening is longer than a length of the protrusion in a projecting direction of the protrusion.

19. The USB device according to claim 1, wherein
the holder includes an outer periphery facing outside of the holder,
a depression is provided in a part of the outer periphery outside the port, the depression into which a tab of a lid that covers the USB connector is fitted.

20. The USB device according to claim 1, wherein
the first extension includes two first extensions, and
the two first extensions extend from the support in a direction orthogonal to the first direction and oppositely to each other.

* * * * *